United States Patent
Cook et al.

(10) Patent No.: US 10,236,837 B2
(45) Date of Patent: Mar. 19, 2019

(54) CIRCUITS, DEVICES AND METHODS FOR REDUCING CO-CHANNEL INTERFERENCE

(71) Applicant: SKYWORKS SOLUTIONS, INC., Woburn, MA (US)

(72) Inventors: Mackenzie Brian Cook, Montreal (CA); John Jackson Nisbet, Ottawa (CA); John William Mitchell Rogers, Nepean (CA)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/453,310

(22) Filed: Mar. 8, 2017

(65) Prior Publication Data

US 2017/0264251 A1    Sep. 14, 2017

Related U.S. Application Data

(60) Provisional application No. 62/305,478, filed on Mar. 8, 2016.

(51) Int. Cl.
| | |
|---|---|
| H03F 1/32 | (2006.01) |
| H03F 3/24 | (2006.01) |
| H03F 3/195 | (2006.01) |
| H04B 1/40 | (2015.01) |
| H03F 1/22 | (2006.01) |
| H03F 3/68 | (2006.01) |
| H04B 1/525 | (2015.01) |

(52) U.S. Cl.
CPC ............. *H03F 3/195* (2013.01); *H03F 1/223* (2013.01); *H03F 3/245* (2013.01); *H03F 3/68* (2013.01); *H04B 1/525* (2013.01); *H03F 2200/108* (2013.01); *H03F 2200/294* (2013.01); *H03F 2200/391* (2013.01); *H03F 2200/414* (2013.01); *H03F 2200/417* (2013.01); *H03F 2200/421* (2013.01); *H03F 2200/45* (2013.01); *H03F 2200/451* (2013.01); *H03F 2200/492* (2013.01)

(58) Field of Classification Search
USPC ........................................ 330/284, 151, 149
See application file for complete search history.

(56) References Cited

U.S. PATENT DOCUMENTS

| | | | | |
|---|---|---|---|---|
| 4,075,566 | A * | 2/1978 | D'Arcangelis | ...... H01Q 3/2623 |
| | | | | 455/276.1 |
| 6,510,308 | B1 * | 1/2003 | Thomas | ................. H04B 1/126 |
| | | | | 455/24 |
| 8,755,756 | B1 * | 6/2014 | Zhang | ................... H04B 1/109 |
| | | | | 455/114.2 |
| 9,590,673 | B2 * | 3/2017 | Hwang | ................. H04B 1/126 |

\* cited by examiner

*Primary Examiner* — Hieu Nguyen
(74) *Attorney, Agent, or Firm* — Chang & Hale LLP

(57) ABSTRACT

Circuits, devices and methods are disclosed, including radio-frequency circuitry comprising a polar modulator configured to invert a sampled transmitted signal into an inverted sampled transmitted signal, a signal combiner configured to combine the inverted sampled transmitted signal with a received signal and a control logic circuit coupled to the polar modulator, the control logic circuit configured to adjust one or more tuning parameters of the polar modulator for inverting the sampled transmitted signal.

20 Claims, 12 Drawing Sheets

CIRCUITS, DEVICES AND METHODS FOR REDUCING CO-CHANNEL INTERFERENCE

CROSS-REFERENCE TO RELATED APPLICATION(S)

This application claims priority to U.S. Provisional Application No. 62/305,478, filed Mar. 8, 2016, and entitled CIRCUITS AND METHODS RELATED TO PHASE SHIFTERS AND COMBINERS, the disclosure of which is hereby incorporated by reference in its entirety.

BACKGROUND

Field

The present disclosure relates to radio frequency (RF) signal processing. RF systems rely on an ability to isolate a desired received signal amongst energy generated by hundreds of sources. It is the job of the receiver to detect a signal of interest while rejecting all others. Modern RF circuits can tolerate blockers (blocking or interfering signals) when they are sufficiently out of the frequency band of the signal of interest, by using filters. A bandpass filter at the front end of a receiver (e.g., superheterodyne, direct down conversion or low intermediate-frequency (IF) receiver) can mitigate the out of band blockers. For signals adjacent to the target band however, the filter will not sufficiently diminish the interference. Due to spectrum congestion, it is now possible for a blocker to be sufficiently close in frequency and space to overload the receiver and decrease the signal-to-noise ratio. In other words, the ability to receive a desired signal is greatly limited when there is a strong near-band interfering signal. A signal that occupies the adjacent band of a desired signal is called co-channel, and the act of hindering reception of such desired signal is called co-channel interference, or CCI.

Description of the Related Art

Amplifier devices can be used in processing radio frequency signals. Certain amplifier devices can generate undesirable distortion, which may affect system performance.

SUMMARY

In accordance with a number of implementations, the present disclosure relates to a radio-frequency circuit comprising a polar modulator configured to invert a sampled transmitted signal into an inverted sampled transmitted signal, a signal combiner configured to combine the inverted sampled transmitted signal with a received signal and a control logic circuit coupled to the polar modulator, the control logic circuit configured to adjust one or more tuning parameters of the polar modulator.

In certain embodiments, the radio-frequency circuit further comprises a directional coupler configured to sample a transmitted signal into the sampled transmitted signal. The radio-frequency circuit may further comprise a low-noise amplifier. In certain embodiments, the received signal is output from the low-noise amplifier. In certain embodiments, the low-noise amplifier receives an output signal from the signal combiner. In some implementations, the low-noise amplifier is combined with the signal combiner. In certain embodiments, the control logic circuit receives a sampled output signal from the low-noise amplifier.

In certain embodiments, the radio-frequency circuit further comprises a received signal strength indicator coupled to the control logic circuit for detecting a power output of the low-noise amplifier. In certain embodiments, the control logic circuit is further configured to adjust one or more tuning parameters of the polar modulator based at least in part on the power output of the low-noise amplifier. In certain embodiments, the polar modulator includes an attenuator for modifying the amplitude of the sampled transmitted signal and one or more phase shifters for modifying the phase of the sampled transmitted signal. In certain embodiments, the one or more phase shifters include a quadrant phase shifter configured to yield a phase shift of approximately 0 degrees, −90 degrees, −180 degrees or 90 degrees.

In certain embodiments, the radio-frequency circuit further comprises a power coupler configured to sample the output power of a power amplifier to generate the sampled transmitted signal. In certain embodiments, the sampled transmitted signal and the received signal are each within a single frequency band of a plurality of adjacent frequencies. In certain embodiments, the sampled transmitted signal and the received signal each have approximately the same frequency.

In accordance with a number of implementations, the present disclosure relates to a radio-frequency module comprising a packaging substrate configured to receive a plurality of components and a semiconductor die mounted on the packaging substrate, the semiconductor die including a radio-frequency circuit including a polar modulator circuit configured to invert a sampled transmitted signal into an inverted sampled transmitted signal, a signal combiner circuit configured to combine the inverted sampled transmitted signal with a received signal and a control logic circuit coupled to the polar modulator, the control logic circuit configured to adjust one or more tuning parameters of the polar modulator.

In certain embodiments, the radio-frequency circuit of the semiconductor die further includes a directional coupler configured to sample a transmitted signal into the sampled transmitted signal. The radio-frequency circuit may further comprise a low-noise amplifier. In certain embodiments, the received signal is output from the low-noise amplifier. In certain embodiments, the low-noise amplifier receives an output signal from the signal combiner. In certain embodiments, the control logic circuit receives a sampled output signal from the low-noise amplifier.

In certain embodiments, the radio-frequency circuit of the semiconductor die of the radio-frequency module further comprises a received signal strength indicator coupled to the control logic circuit for detecting a power output of the low-noise amplifier. In certain embodiments, the control logic circuit is further configured to adjust one or more tuning parameters of the polar modulator based at least in part on the power output of the low-noise amplifier. In certain embodiments, the polar modulator includes an attenuator for modifying the amplitude of the sampled transmitted signal and one or more phase shifters for modifying the phase of the sampled transmitted signal. In certain embodiments, the one or more phase shifters include a quadrant phase shifter configured to yield a phase shift of approximately 0 degrees, −90 degrees, −180 degrees or 90 degrees.

In some implementations, the present disclosure relates to a semiconductor die comprising a semiconductor substrate and a radio-frequency circuit implemented on the semiconductor die, the radio-frequency circuit including a polar modulator circuit configured to invert a sampled transmitted signal into an inverted sampled transmitted signal, a signal combiner circuit configured to combine the inverted sampled transmitted signal with a received signal and a control logic circuit coupled to the polar modulator, the control logic circuit configured to adjust one or more tuning parameters of the polar modulator. In some implementations, the semiconductor substrate includes a silicon-on-insulator (SOI) substrate.

In some implementations, the present disclosure relates to a radio-frequency device comprising a transceiver configured to process radio-frequency signals, one or more antennas in communication with the transceiver, the one or more antennas configured to facilitate transmission of an amplified radio-frequency signal, and a radio-frequency circuit connected to the transceiver, the radio-frequency circuit including a polar modulator configured to invert a sampled transmitted signal into an inverted sampled transmitted signal, a signal combiner configured to combine the inverted sampled transmitted signal with a received signal, and a control logic circuit coupled to the polar modulator, the control logic circuit configured to adjust one or more tuning parameters of the polar modulator. In certain embodiments, the radio-frequency device includes a wireless device.

In some implementations, the present disclosure relates to a method for reducing co-channel interference, the method comprising sampling a transmitted signal into a sampled transmitted signal, modulating one or more of the amplitude and phase of the sampled transmitted signal to generate an inverted sampled transmitted signal, and combining the inverted sampled transmitted signal and a received signal to generate a low-interference received signal. In some implementations, the method further comprises amplifying the low-interference received signal through a low-noise amplifier to generate an amplified received signal. In some implementations, the method further comprises detecting the power of the amplified received signal and adjusting one or more parameters for modulating one or more of the amplitude and phase of the sampled transmitted signal, based at least in part on the detected power of the amplified received signal.

In some implementations, the method further comprises transmitting the transmitted signal simultaneously while receiving the received signal in a single frequency band. In some implementations, the method further comprises amplifying the received signal through a low-noise amplifier before combining with the inverted sampled transmitted signal.

BRIEF DESCRIPTION OF THE DRAWINGS

Various embodiments are depicted in the accompanying drawings for illustrative purposes, and should in no way be interpreted as limiting the scope of the inventions. In addition, various features of different disclosed embodiments can be combined to form additional embodiments, which are part of this disclosure. Throughout the drawings, reference numbers may be reused to indicate correspondence between reference elements.

DETAILED DESCRIPTION OF SOME EMBODIMENTS

Figure 1:
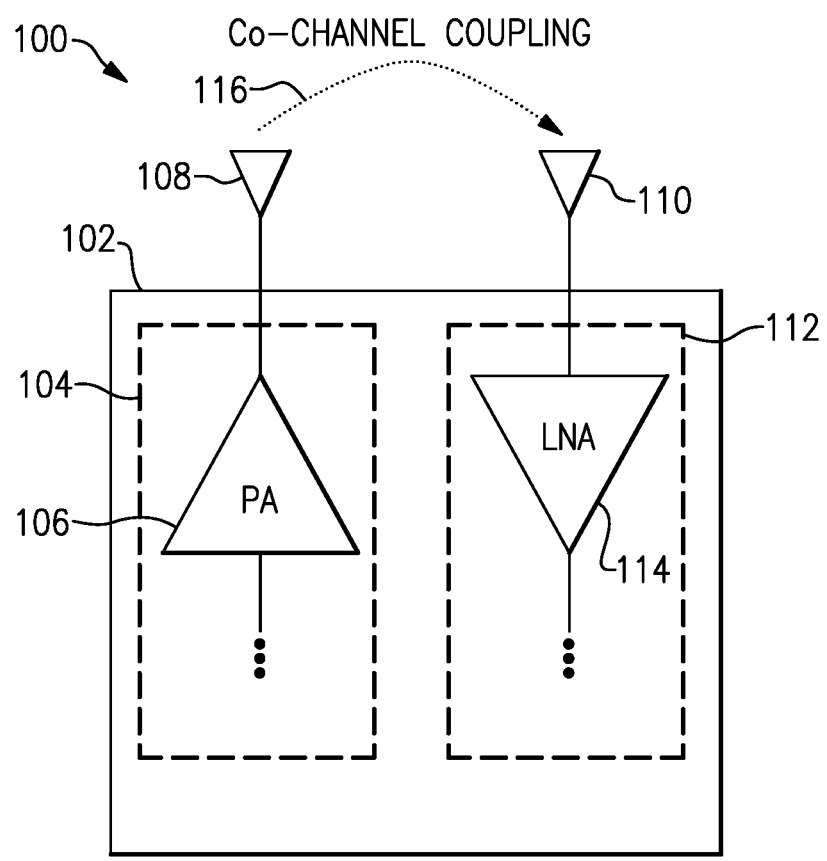
FIG. 1 shows a simplified system architecture experiencing co-channel interference according to one or more embodiments.

The headings provided herein, if any, are for convenience only and do not necessarily affect the scope or meaning of the claimed invention.

An increasingly congested frequency spectrum has presented an unfortunate opportunity for two independent radios on the same device to transmit and receive signals simultaneously using adjacent frequency bands. Currently, co-channel coexistence requires temporal scheduling to prevent co-channel interference from disrupting downlink communications. The present disclosure presents a method of front end co-channel interference cancellation within the receive chain of a co-channel transceiver to allow for simultaneous transmit and receive operation.

An extremely compact co-channel interference canceller (CCIC) is presented herein. A polar modulator in a feed-forward path creates an inverted copy of the on-board interference signal at RF and recombines in the front end LNA for cancellation. The disclosed co-channel interference reduction system contains efficient phase shifters and digital capacitor architectures and an efficient front end combination circuit.

The two main schools of thought on mitigating CCI are to reduce the antenna spatial coupling that causes the interference, or to accept its presence and eliminate it within the receiver. Antenna coupling reduction has been attempted by use of null-beam steering, or spatial filtering between systems. Null-beam steering is used to direct a null of the receive antenna array in the direction from which an interferer is coming from. A null is a direction in space to which an antenna does not direct energy towards or receive energy from. This concept is known as spatial filtering and has long been known as an effective means to reduce co-channel interference (CCI). Briefly, beam steering requires an array of antennas. The direction in which the overall array propagates in the far field is determined by the summation of EM fields from each antenna. Due to the spatial separation, the phase of the signals from each antenna is not equal. At a single point in space, the net EM propagation will range from all in phase to anti-phase. Ideal anti-phased signals sum to zero, producing a null, and in-phase produces "lobes" or beams. By controlling the phase of one or all of the branches in the antenna array, the location of the lobes and/or nulls can be directed as desired. Beam steering is the act of directing the maximum of the lobe in a desired direction to maximize reception in that direction. Spatial filtering, or null-beam steering, is the act of positioning the null in the direction from which reception is undesirable. Ideally, to reduce CCI, a receive antenna array would position a null in the direction of the co-channel source, preventing its reception.

This filtering in space is ideal for multiple-input, multiple-output (MIMO) systems where the CCI is external. Unfortunately this method does not lend itself well to intra-device CCI, where the interferer is located on the same board. If two of the device's radios are co-channel, it is also likely that a mobile phone will make use of the same antenna for cost and space reduction measures. In this case, beam steering will not remove energy already within the system.

For separate antennas, which are tightly packed onto a handset, there are significant challenges. In order to change the propagation direction of an antenna, you need a physically separated array of antennas with phase shifting elements. Directing the beam is extremely challenging within a mobile phone because the element-to-element separation required is difficult to attain. In particular, the cost of adding numerous antennas and phase shifters and increasing the complexity of the mechanical and electrical design of the device would outweigh any gains made by its successful operation. For this and other reasons, transmit and receive scheduling remains the preferred method of addressing CCI in mobile devices.

FIG. 1 shows a simplified system architecture 100 experiencing co-channel interference 116 according to one or more embodiments. Module 102 includes a first radio 104 which includes a power amplifier 106 for transmitting a signal over antenna 108. Additionally, module 102 includes a second radio 112 which receives a signal from antenna 110, and in some implementations, passes it through a low-noise amplifier 114. In some implementations, multi-radio system 100 utilizes a single antenna, therefore antenna 108 and antenna 110 are the same component. Multi-radio system 100 illustrates the coupling 116 of the transmitted signal from first radio 104, to second radio 112, simultaneously receiving a received signal.

In some implementations, first radio 104 is transmitting a signal over a first frequency that is adjacent to a second frequency used by the second radio 112 to receive a signal. In some implementations, adjacent frequencies are frequencies immediately next to each other within a detectable resolution of a receiving antenna (e.g., 2400 MHz and 2401 MHz). In some implementations, adjacent frequencies are frequencies within a detectable band of a receiving antenna (e.g., 2400 MHz and 2500 MHz within a band of 2400-2600 MHz). In some implementations, first radio 104 is transmitting a signal over a first frequency that is effectively (e.g., detectably) the same as a second frequency used by the second radio 112 to receive a signal. For example, the first frequency is 2400 MHz and the second frequency is detected to be 2400 MHz as well. The effective equivalence of the first and second frequencies may be defined by the resolution and detection capability of the detection circuitry.

An example of how this co-channel interference may potentially be experienced, is found in a typical smartphone. In modern telecommunication devices, a high-powered transmitter of one radio is usually located within millimeters or centimeters of a receiver of another radio. With the adoption of LTE (Long Term Evolution), or other cellular communications standards, there is greater opportunity for a cellular device to self-interfere. For example, both Bluetooth and Wi-Fi operate at 2.4 GHz, a frequency that overlaps with some LTE communications. If a Wi-Fi transmission (e.g., over radio 104) occurs at the same time as an LTE downlink (e.g., over radio 112), the spectral leakage of the Wi-Fi transmission will raise the noise floor in the LTE band well above a weak desired signal, effectively reducing its Signal to Noise Ratio (SNR) to zero (or below a detectable threshold), and blocking the LTE downlink. High-powered signals may still be received, but the dynamic range (e.g., the difference between the minimum power received signal and maximum power) of the system will be severely degraded.

While this example discloses co-channel interference in the context of Bluetooth, Wi-Fi and LTE communications in a mobile device, it should be understood that this is a non-limiting example. The principles of reducing co-channel interference presented in this disclosure are applicable to other communication standards and other devices.

Figure 2:
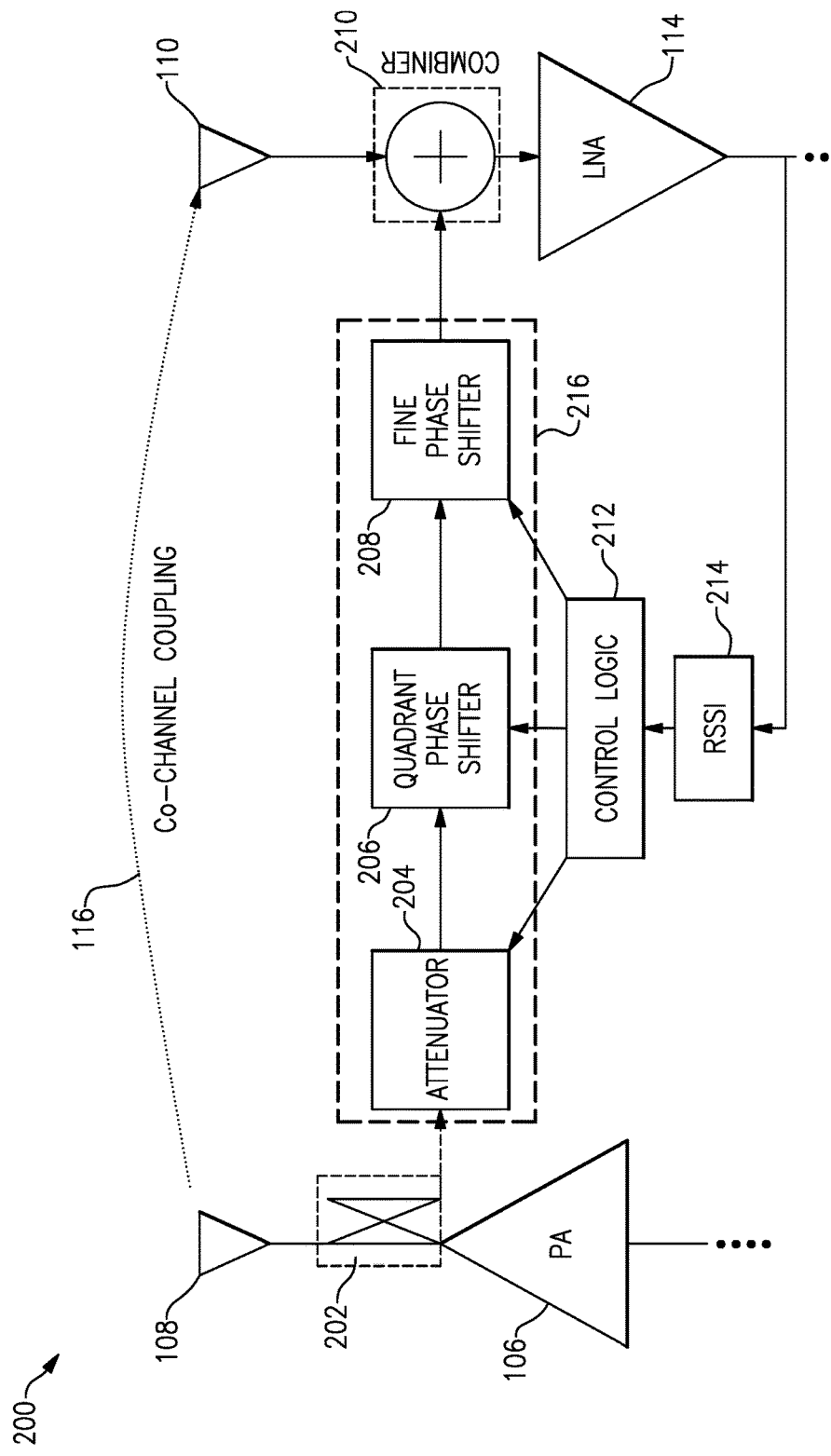
FIG. 2 shows a system architecture for reducing co-channel interference according to one or more embodiments.

FIG. 2 illustrates a system architecture 200 for reducing co-channel interference 116 at a receiver. At a minimum, system architecture 200 includes a polar modulator 216, a signal combiner 210 and control logic 212. In some implementations, as shown in FIG. 2, system architecture 200 includes a directional coupler 202, and a received signal strength indicator (RSSI) 214. System architecture 200 may include one or more components as described above with respect to FIG. 1, such as antenna 108, antenna 110, PA 106 and LNA 114. In some implementations, some or all of the components of system architecture 200 are implemented on a single semiconductor die.

Directional coupler 202 may be used to sample the output signal of PA 106, resulting in a sampled transmitted signal. In order to cancel the interferer, a copy of the signal needs to be taken from the transmitter. PA 106 introduces many nonlinearities to the transmit signal, therefore, in some implementations, the copy is taken at the output of PA 106 to ensure all signal components found in the receiver are accurately replicated. The copy can be obtained by using directional coupler 202 to siphon a small portion of the transmit power from the output of the PA 106. Consequently, the PA design would need to factor in the coupler to compensate for the output power loss. For example, a −10 dB coupler would cause a forward attenuation of 0.9, or 0.46 dB. In some implementations, directional coupler 202 is implemented as a part of PA 106, while in some implementations, directional coupler 202 is a separately implemented circuit block. In some implementations, PA 106 and directional coupler 202 are implemented on the same single semiconductor die.

Polar modulator 216 may include one or more component circuit blocks, used to invert a sampled transmitted signal from directional coupler 202. For example, as shown in FIG. 2, polar modulator 216 includes an attenuator 204, a quadrant phase shifter 206 and a fine phase shifter 208, each described in greater detail below. In some implementations, phase shifting of a sampled transmitted signal is performed by a single phase shifter. Inverting the sampled transmitted signal through the use of amplitude and phase modification in polar modulator 216, is intended to generate an inverted sampled transmitted signal that ideally cancels out the transmitted signal when combined with it.

In practice, polar modulator 216 or the components thereof, may utilize one or more modulation parameters to generate the inverted sampled transmitted signal. In some implementations, an initial set of modulation parameters used by polar modulator 216 does not effectively generate an inverse signal of the transmitted signal out of PA 106. For example, the initial set of modulation parameters may include a default, or predefined set of values to generate a first attempt at generating an inverse of the transmitted signal. In some implementations, control logic circuitry 212 changes or updates a set of modulation parameters for polar modulator 216 and/or the components thereof.

As can be seen in FIG. 2, the inverted sampled transmitted signal needs to be combined (e.g., effectively subtracted) at the input of the receiver using signal combiner 210, to cancel the undesired signal. For cancellation to occur, the phase and amplitude of the inverted sampled transmitted signal must match the phase and amplitude of the signal received at antenna 110. There is no control over the interfering signal (e.g., the transmitted signal) once it leaves PA 106, and the propagation properties will be affected by objects in proximity to the telecommunication device comprising system 200. Therefore, the phase and/or amplitude of the inverted sampled transmitted signal is adjustable using a polar modulator 216 (e.g., through the use of one or more attenuators 204 and/or one or more phase shifters 206, 208), along with control logic circuitry 212 to make changes to the amplitude and/or phase adjustments as needed. In some implementations, the amplitude of a sampled transmitted signal is first adjusted using one or more attenuators 204, before performing a quadrant phase shift of the sampled transmitted signal in increments of 90 degrees. Finally, a fine adjustment of the phase of the sampled transmitted signal may be performed to obtain an inverted sampled transmitted signal.

In some implementations, signal combiner 210 combines a received signal from antenna 110, with the inverted sampled transmitted signal from polar modulator 216. In some implementations, the received signal from antenna 110 includes a desired signal to be received (e.g., an LTE downlink), merged with an undesired coupled signal from antenna 108 (e.g., a Wi-Fi uplink). As the inverted sampled transmitted signal is ideally a negative or inverse of the transmitted signal, signal combiner 210 effectively cancels out the coupled, undesirable signal from the received signal, to result in a low-interference received signal. The output of the signal combiner 210, the low-interference received signal, may be passed through LNA 114 to generate an amplified received signal. In some implementations, signal combiner 210 is combined with LNA 114.

In some implementations, a received signal strength indicator (RSSI) 214, can be coupled to the output of LNA 114 to measure the signal strength of the amplified received signal. The RSSI 214 may be coupled to control logic circuitry 212 to provide feedback and a basis for adjusting one or more modulation parameters. In some implementations, RSSI 214 or the functionality of this circuitry, is incorporated into control logic circuitry 212.

System 200 may include or rely on additional components not shown, such as one or more duplexers. It should be understood that references to a single component may in practice include a plurality of components, such as a plurality of power amplifiers (PAs) 106 configured to amplify RF signals from a transceiver. An amplified RF signal can pass through a corresponding one of the duplexers, and be routed to an antenna through an antenna switch. In some embodiments, the same antenna(s) can be utilized to receive an RF signal, and such a received signal can be routed to one or more a low-noise amplifiers 114 through a corresponding one of the duplexers. An amplified signal output from the LNA 114 may be routed to a transceiver for further processing. In some implementations, a receiver of a transceiver, as described in the present disclosure, operates simultaneously with a transmitter of the same transceiver.

Quadrant and Fine Phase Shifters

Phase shifting is an important operation in many RF applications. For example, phase shifters are commonly used in signal cancellers and equalizers. Phase shifters are also used in beam steering, where a phased antenna array directs the antenna energy in a desired direction, which is commonly used in radar and non-line-of-sight (NLOS) operations. In dynamic gain equalizers, phase shifters are used to fit the attenuation profile of the equalizer to a desired one to compensate for non-flat gain responses across a communication band. Other applications can also utilize phase shifters. Disclosed are examples of one or more designs related to a highly compact phase shifter that can include a digitally tuned transmission line and an ambidextrous quadrant selector.

In some embodiments, a quadrant shifter can be designed by utilizing fixed quarter wave transmission lines that can be switched in or out to select a quadrant desired. For example, to select the four quadrants, one can implement three quarter wave sections selectable by switches. With three sections, there would be three inductors which typically occupy the majority of physical area in this and other example circuits.

Figure 3:
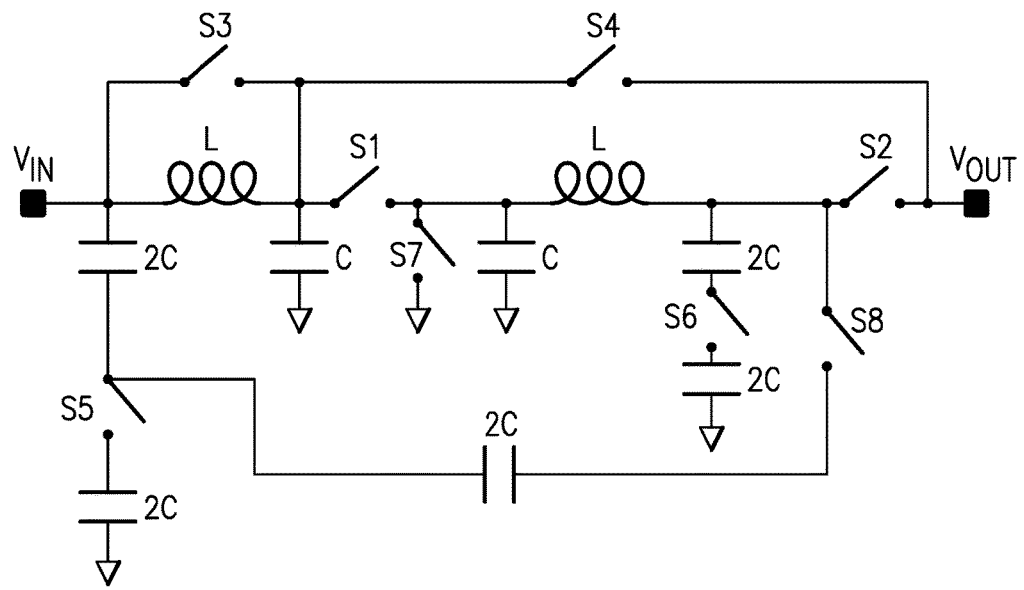
FIG. 3 is a circuit diagram of phase shifter, in accordance with some implementations.

An example architecture shown in FIG. 3 can employ inductor reuse in combination with switches to accomplish substantially the same goal, but with two inductors instead of three. It can achieve such functionality by electrically reconfiguring the circuit's inductors between series and parallel connections to make use of left handed lumped transmission lines, which can provide substantially the opposite phase shift of a right handed version. The architecture can be configured to select between some or all of bypass, single right handed quarter wave, double right handed quarter wave, and single left handed quarter wave states, which can provide 0°, 90°, 180° and +90° of phase shift respectively.

The example architecture shown in FIG. 3 can provide such phase shifting functionality by controlled switching of one or more of switches S1 to S8. For example, in a bypass state, both bypass switches (S3, S4) can be closed (ON), and all other switches can be opened (OFF). A single right handed transmission line can be formed by creating a shunt C at the input, and activating the bypass switch at the output. More particularly, a shunt switch S5 can be closed, the bypass switch S4 can be closed, and all other switches can be opened. Two series quarter wave transmission lines can be formed to produce a 180° phase shift. Such a configuration can be achieved by shunt switches S5 and S6, and switches S1 and S2 being closed, and all other switches being open. Both inductors can be shunted to ground from the input and output using a switch S7 to ground in the middle of the circuit. For example, switches S1, S2, S7 and S8 can be closed, and all other switches can be opened. In such a configuration, a series capacitance C can be created using the series combination of the capacitance 2C at the input and 2C connecting to the output through the closed switch S8. The previously shunted capacitance 2C to ground is disconnected by opening the shunt switch S5 at the input.

Such a configuration creates a left handed transmission line with two series capacitors of 2C, creating C, and two shunt inductors to ground.

Referring to the example configurations of the quadrant phase shifter of FIG. 3, it is noted that in addition to a significant area reduction, this design can also provide a more consistent loss between states and a lower maximum loss than that of traditional three quarter wave transmission lines. For example, the architecture of FIG. 3 can have the most loss in the double transmission line state (e.g., for 180° phase shift), rather than triple in the traditional configuration (e.g., for 270° phase shift).

In some embodiments, a fine tuning phase shifter can include two series lumped element transmission lines, where some or all of the capacitors can be replaced with variable capacitors to enable tuning. An example of such a fine tuning phase shifter is shown in FIG. 4.

Figure 4:
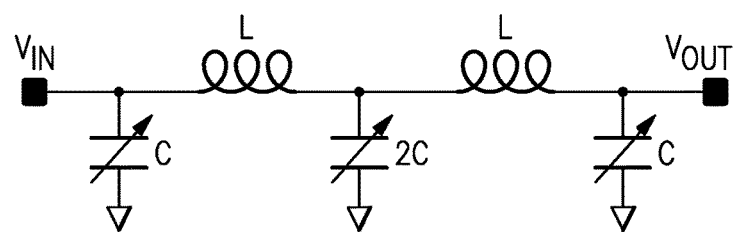
FIG. 4 is a circuit diagram of a fine tuning phase shifter, in accordance with some implementations.

Referring to the example of FIG. 4, such an architecture can utilize high-ratio variable capacitors described herein in order to, for example, achieve 90° of total phase shift while maintaining, for example, a 50 Ω match with two inductors. In some embodiments, each capacitor can have a 4-bit resolution, thereby enabling approximately 6° resolution $(90/(2^4) \approx 6)$ for 90° of total phase shift.

High Ratio Switched Variable Capacitors

A phase shifter having one or more features as described herein can be designed to have a very low area use. Traditional MOS varactors typically have a $C_{MAX}:C_{MIN}$ near 3:1. By using real components such as MOS varactors instead of ideal components, the capacitance ratio would likely be insufficient to achieve greater than 90° of phase shift with two transmission line segments. Such a design can therefore utilize three series transmission lines to reach 90° of phase shift. However, if a variable capacitance with a higher ratio is utilized, a larger phase shift can be attainable and using two sections. Such a design can reduce the area considerably by being able to use two sections instead of three as compared to using MOS varactors.

Figure 5A:
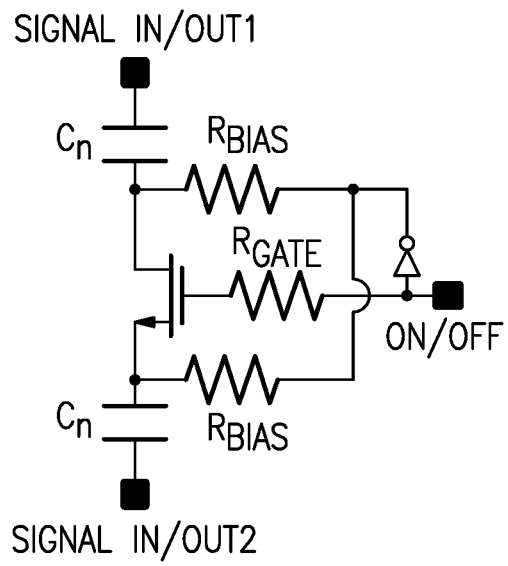
FIG. 5A is a schematic of a circuit embodying a switching capacitance in accordance with an aspect of the present disclosure.
Figure 5B:
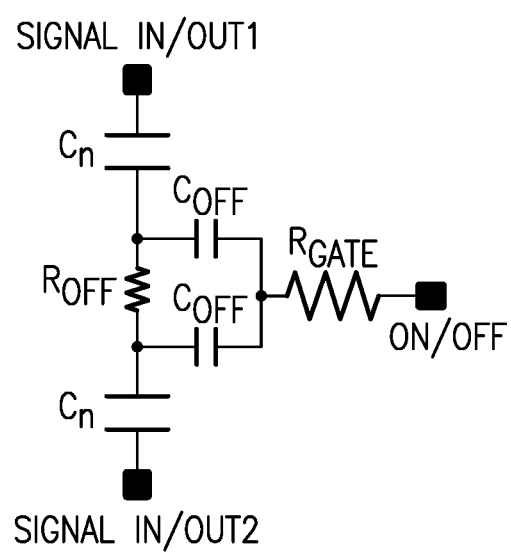
FIG. 5B is a schematic of a circuit embodying a switching capacitance in accordance with an aspect of the present disclosure.

Examples of circuits implementing a switchable capacitance are shown in FIGS. 5A and 5B. More particularly, FIG. 5A shows an example of a cross-biased switch, where gate and channel are inversely biased. FIG. 5B shows an equivalent circuit when the gate is low (off). It is noted that by using switches which are DC decoupled with fixed capacitors in parallel, capacitance can be added or removed digitally. Cross biasing of the switches as shown in FIG. 5A, where the channel and gate are biased to opposite potentials, can include a number of benefits.

For example, a benefit can include a feature where the switch does not turn on or turn off easily due to a high powered RF signal. Another advantage is that by splitting the desired capacitance into two series capacitors, they can also act to block DC. Accordingly, traditionally large (e.g., RF short) DC blocking capacitors are not required, which in turn can reduce area consumption. Another benefit associated with the design is that the capacitance will be generally symmetrical because the switch's source and drain are symmetrical; accordingly, the isolating capacitors can have approximately the same value if desired.

Figure 6:
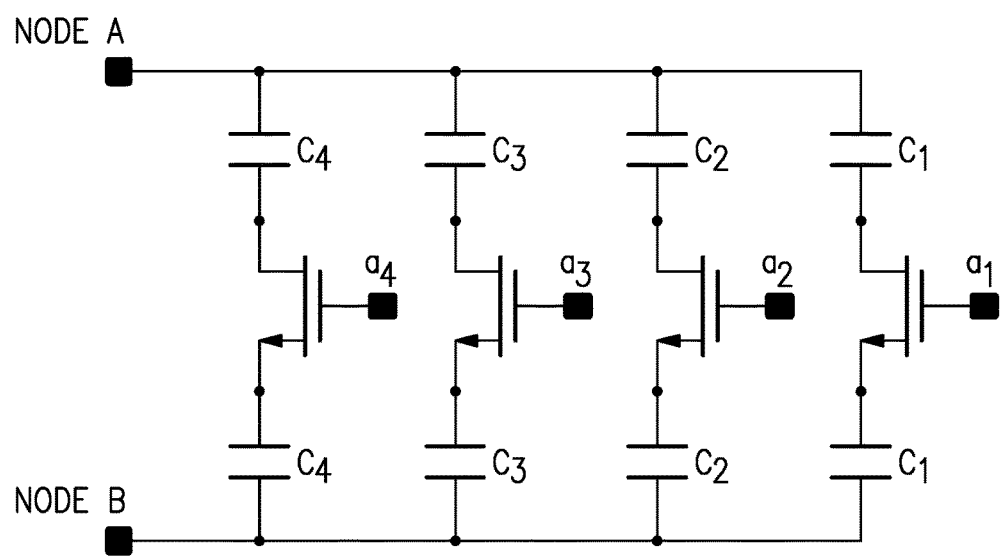
FIG. 6 is a schematic of a 4-bit variable capacitor in accordance with an aspect of the present disclosure.

FIG. 6 shows an example architecture of a 4-bit variable capacitor. In FIG. 6, a change in capacitance, $\Delta C_n$, can be toggled using a control signal $a_n$ at the gate of a respective switch. A desired capacitance step can be the difference between two $C_n$ in series with the $R_{ON}$ of the switch, and two $C_n$ and two $C_{OFF}$ in series as seen in FIG. 5B. The latter assumes a large $R_{GATE}$ resistor and a large $R_{OFF}$ of the switch. $C_{OFF}$ is the capacitance between source/drain and gate when the switch is off as shown in FIG. 5B.

In some embodiments, $C_n$ can be chosen to provide desired capacitance steps, and the number of bits can be expandable. Such a design can have a $C_{MAX}:C_{MIN}$ ratio dependent of the selected $C_n$ and only be limited at the low end by $C_{OFF}$. Therefore, a large highly-linear capacitance ratio can be achieved using this architecture.

Phase Shifter Assembly

Figure 7:
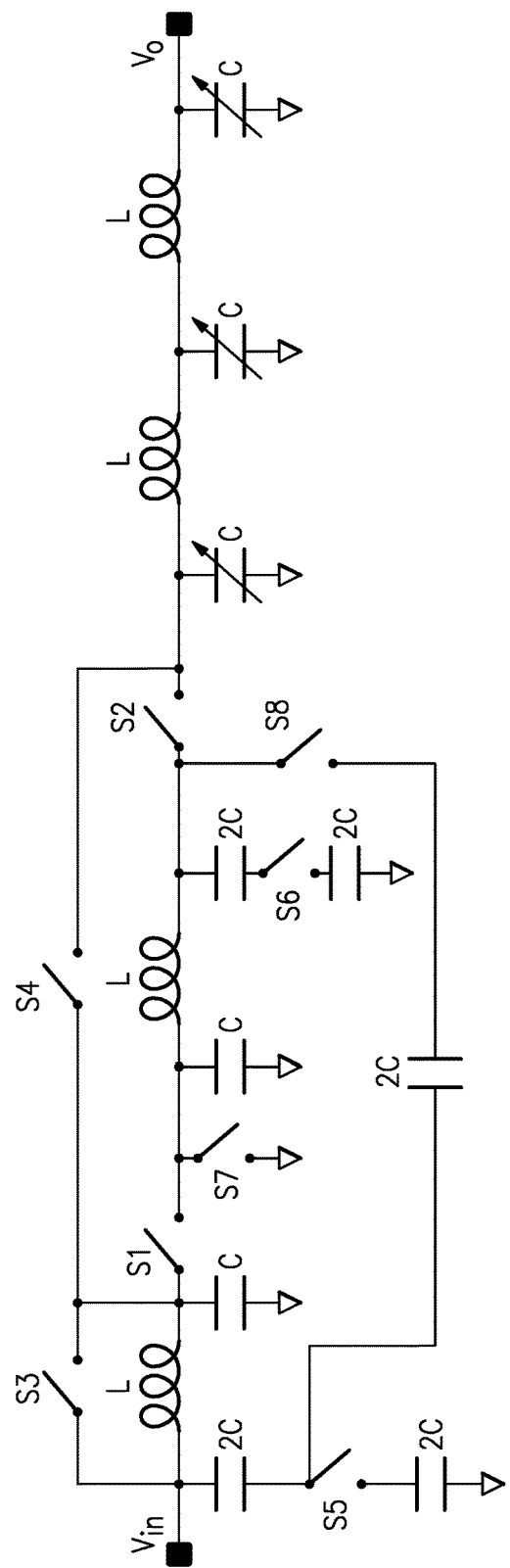
FIG. 7 is a schematic of a phase shifter assembly embodying an aspect of the present disclosure.

In some embodiments, a phase shifter assembly can include a fine shifter with high-ratio variable capacitors, as described herein, in series with an ambidextrous quadrant selector, also as described herein. Such a design can be implemented as a 6-bit phase shifter, for a total of 64 phases across 360°. In some embodiments, such a phase shifter assembly can be configured to be substantially entirely passive, and only draw current when changing states. An example of such a phase shifter is shown in FIG. 7.

Attenuators are used in RF and Analog systems to adjust signal levels, control impedance mismatch, and to isolate circuit stages. Digital attenuators use a control word to dictate the level of attenuation achieved. Within the polar modulator 216 of FIG. 2, the attenuator 204 may be used to control the signal amplitude in order to match the interfering signal (e.g., sampled transmitted signal) strength to that of the undesired component in the received signal. As explained with respect to FIG. 2, in combination with an inverted phase of the signal, correct signal strength will lead to cancellation of the undesired signal. In some implementations, the attenuator 204, like the one or more phase shifters 206, 208, is a passive component, consuming energy only when switching from one state to another.

Figure 8A:
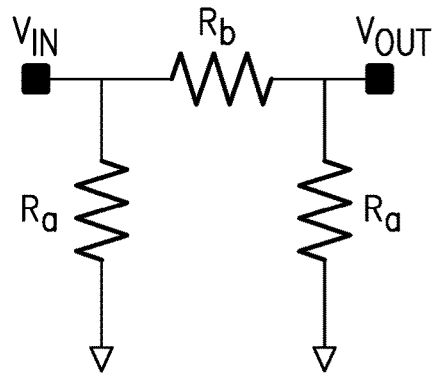
FIG. 8A is a circuit diagram of a pi-pad attenuator core in accordance with some embodiments.
Figure 8B:
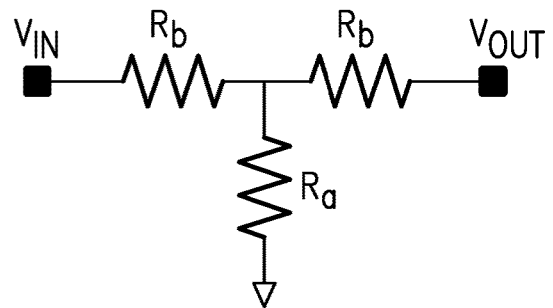
FIG. 8B is a circuit diagram of a T-pad attenuator core in accordance with some embodiments.
Figure 8C:
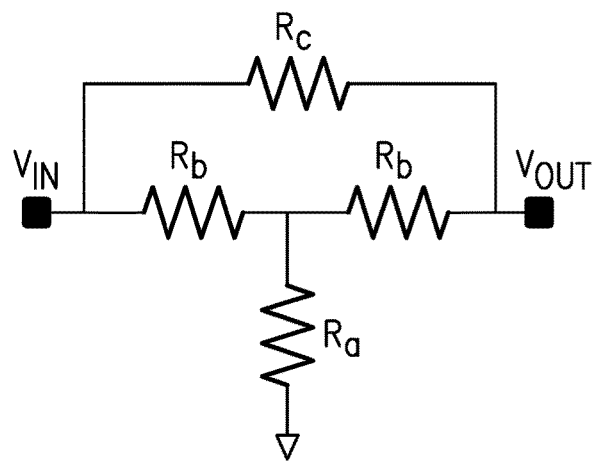
FIG. 8C is a circuit diagram of bridged-T attenuator core in accordance with some embodiments.

Passive attenuators have a core which commonly uses one of three structures or "pads", the pi-pad shown in FIG. 8A, T-pad shown in FIG. 8B, or bridged-T attenuator shown in FIG. 8C. The pi-pad and T-pad circuits can be used to match unequal impedances however the bridged-T, given the bridged resistance, cannot be used to match unequal impedances. In some implementations, the pi-pad is utilized in an attenuator such as attenuator 204 for ease of implementation and layout efficiency.

Figure 9:
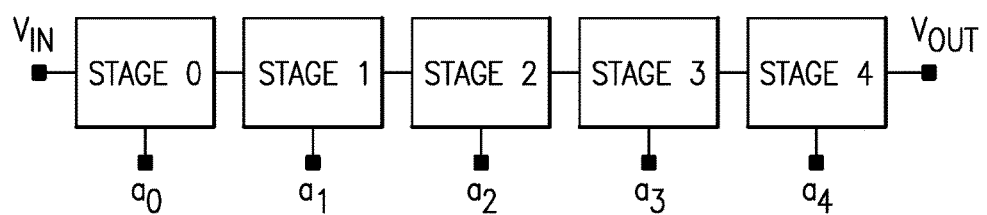
FIG. 9 is a block diagram representing an attenuator according to one or more embodiments.

FIG. 9 is a block diagram representing an attenuator according to one or more embodiments. In some implementations, to select the desired attenuation with equal attenuation steps throughout the entire range, binary weighted stages are used. In some implementations, binary weighting occurs logarithmically, (e.g., 0.7 dB, 1.4 dB, 2.8 dB etc.). In some implementations, when the control bit $a_x$ is low, the attenuator core in the respective stage is bypassed, and when $a_x$ is high, the core is active and the attenuation increases (e.g., by $0.7(2^x)$ dB). The order of the stages can be altered to suit different design needs such as linearity or input/output impedance.

In some implementations, stages of the attenuator block diagram are arranged from lowest level of weighting to highest. When a respective bypass switch is closed, the corresponding attenuator core of the corresponding stage will create a voltage difference across the switch, and the voltage difference will be larger for higher attenuation. For example, an 11.2 dB stage (e.g., stage 4) will have a greater voltage across its bypass switch than a 1.4 dB stage (e.g., stage 1), which could cause it to unintentionally exit the cutoff state and turn on partially or fully, introducing distortion and changing the attenuation. Therefore, for linearity and attenuation level concerns, in some implementations, the highest attenuation is placed last to minimize the signal power that is applied to it. A lower attenuation core will have a lower voltage difference across the switch and, for equivalent switch sizing, will have higher linearity due to lower peak $V_{DS}$.

Each attenuation stage will need to be bypassed if the respective stage is not selected by the attenuation control word. As switches have non-zero attenuation themselves, in some implementations, the attenuator core needs to be designed so that the difference between the bypass attenuation and through-pass attenuation is equal to the desired step size. For example, if the bypass state has an insertion loss of 0.3 dB, then a 0.7 dB stage will require a core whose attenuation is 1 dB. This will yield an attenuation step of 0.7 dB as desired. In some implementations, to properly bypass the attenuation core, the shunt components need to be opened to prevent current from continuing to flow to ground.

Hybrid Amplifier and Signal Combiner

Figure 10:
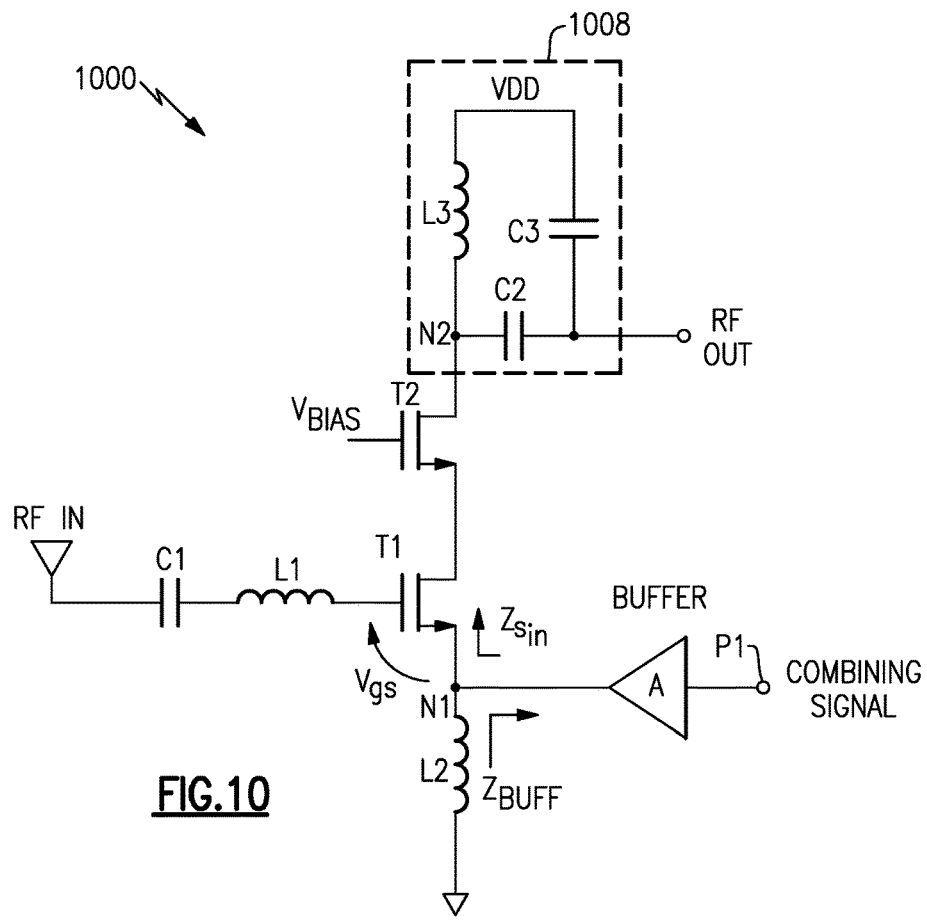
FIG. 10 is a circuit diagram representing RF circuitry including an LNA and a signal combiner according to one or more embodiments.

As described above, it may be desirable to provide low-noise amplification to a combined signal in order to prevent amplification of undesired noise. As an alternative to embodiments disclosed above in which signal combining is performed using an RF signal combiner prior to the low-noise amplifier (LNA) in the signal path, FIG. 10 is a circuit diagram representing RF circuitry 1000 including an amplifier combined with a signal combiner according to one or more embodiments. In certain embodiments comprising a FET transistor LNA, the combining signal may be provided at a source of one of one or more transistors of the LNA.

The configuration of the circuitry 1000 may at least partially prevent an undesired signal from entering the LNA and being amplified by injecting a copy or variation of a known undesired signal on the transistor gate into the source, which may resulting in substantially no $V_{GS}$. The cancellation may occur before the transistor amplifies the signal, preventing the need to design the LNA to handle additional input power associated with the RF input signal distortion.

In certain embodiments, the signal to be combined with the RF input is effectively injected into the signal path using the source terminal of one or more transistors of the LNA prior to amplification by the LNA and in a manner that at least partially avoids loading the input of the LNA and degrading receive noise. While certain transistors are described herein with reference to source and/or drain nodes, it should be understood that such embodiments may be implemented in configurations where references to a source may be instead the drain, and vice versa. That is, any reference to, or description of, a source of a transistor may be representative of a drain, and vice versa. An impedance, such as one or more inductors and/or capacitors, may be connected between the source of T1 and ground.

The circuitry 1000 includes a cascode LNA comprising a common source transistor T1 and a common gate transistor T2. Although a cascode amplifier having two transistors T1, T2 is shown, it should be understood that various other amplifier configurations are possible having any desirable or practical number of transistors. The cascode configuration may provide advantageous input-output isolation, input and/or output impedance, gain, and/or bandwidth characteristics. An RF input signal may be provided at the gate of the common source transistor T1, which may be matched with a gate inductor L1 and/or a source inductor L2. The output signal may be supplied at an output tank 1008 (comprising C2, C3 and L3), connected to a drain node N2 of the common gate transistor T2.

A combining signal port P1 is connected to the source of the common source transistor T1. In certain embodiments, a buffer stage (e.g., source follower) output is injected into the source of the transistor T1. The buffer may be omitted in certain embodiments. The buffer may be implemented to present a substantially constant, pre-defined impedance to the source of the driver transistor T1 to create a desired coupling coefficient when loaded with, for example, a source inductor L2 and/or source of the LNA.

By connecting the combining signal (e.g., with or without a buffer), and applying a signal into a source of the transistor T1 while substantially simultaneously injecting a signal into the gate of the transistor, the circuit 1000 may result in the creation of two separate gate-to-source voltage signals that effectively sum together. In certain embodiments, an undesired frequency component of the RF input signal may effectively sum to be zero, leaving only the desired signal as output of the amplifier. In certain embodiments, an undesired frequency component of the RF input signal effectively sums with the coupling component, leaving primarily the desired signal as output of the amplifier.

In certain embodiments, output circuitry 1008 is coupled to the output drain of the transistor T2, which may serve to at least partially enable an output match while maintaining a desirable level of gain. Although certain output circuitry elements are illustrated, it should be understood that output circuitry may have any desirable components/elements or configuration, or may be omitted, within the scope of the present disclosure. For example, the output circuitry 1008 may instead comprise a simple resistive and/or inductive load, or any other series or parallel elements or buffer circuitry. In the illustrated embodiments, the capacitors C2, C3 may form a voltage divider for impedance matching purposes.

While various passive and/or active circuit elements are shown, any of such elements may be omitted in certain embodiments, and further additional passive and/or active elements may be included in various embodiments. The circuitry 1000 may include a DC blocking capacitor C1 on the RF input line. Gate (L1) and/or source (L2) inductors may further be included for providing simultaneous noise/input matching. For example, the gate inductor L1 and the source inductor L2 may provide a 50 ohm match at the input of the amplifier. In certain embodiments, the circuitry 1000 includes a source resistor (not shown) in addition to, or instead of, the inductor L2.

The buffer stage may serve to buffer impedance variations at the input of the buffer, such as from a phase shifter or attenuator, for example, in order to present a substantially constant impedance to the LNA and/or prevent significant variations in performance of the LNA. In certain embodiments, the buffer is omitted. The buffer may comprise one or more FET transistors and/or capacitors, among possibly other elements. As described above, in certain embodiments, no separate signal combiner is provided in front of the radio-frequency circuitry 1000 in the signal path.

Although certain embodiments are described herein in the context of FET-based LNAs, it should be understood that principles disclosed herein may be applicable in other types of LNA devices, such as bipolar junction transistor (BJT)-based LNAs, for example. For example, the combining signal may be injected into an emitter of a BJT amplifier.

Figure 11:
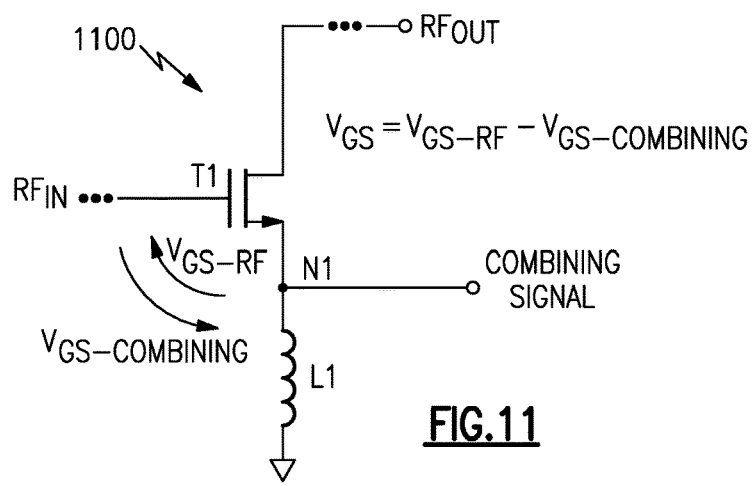
FIG. 11 is a circuit diagram representing RF circuitry including an amplifier combined with a signal combiner according to one or more embodiments.

FIG. 11 is a circuit diagram representing RF circuitry 1100 including an amplifier (T1) combined with a signal combiner according to one or more embodiments described in the present disclosure. The diagram of FIG. 11 shows how the combined signal including the RF input signal and the combining signal may be seen as the gate-to-source voltage ($V_{GS}$) formed from the effect of the input RF signal summed with the combining signal injected into the source.

Methods of Reducing Co-channel Interference

Figure 12:
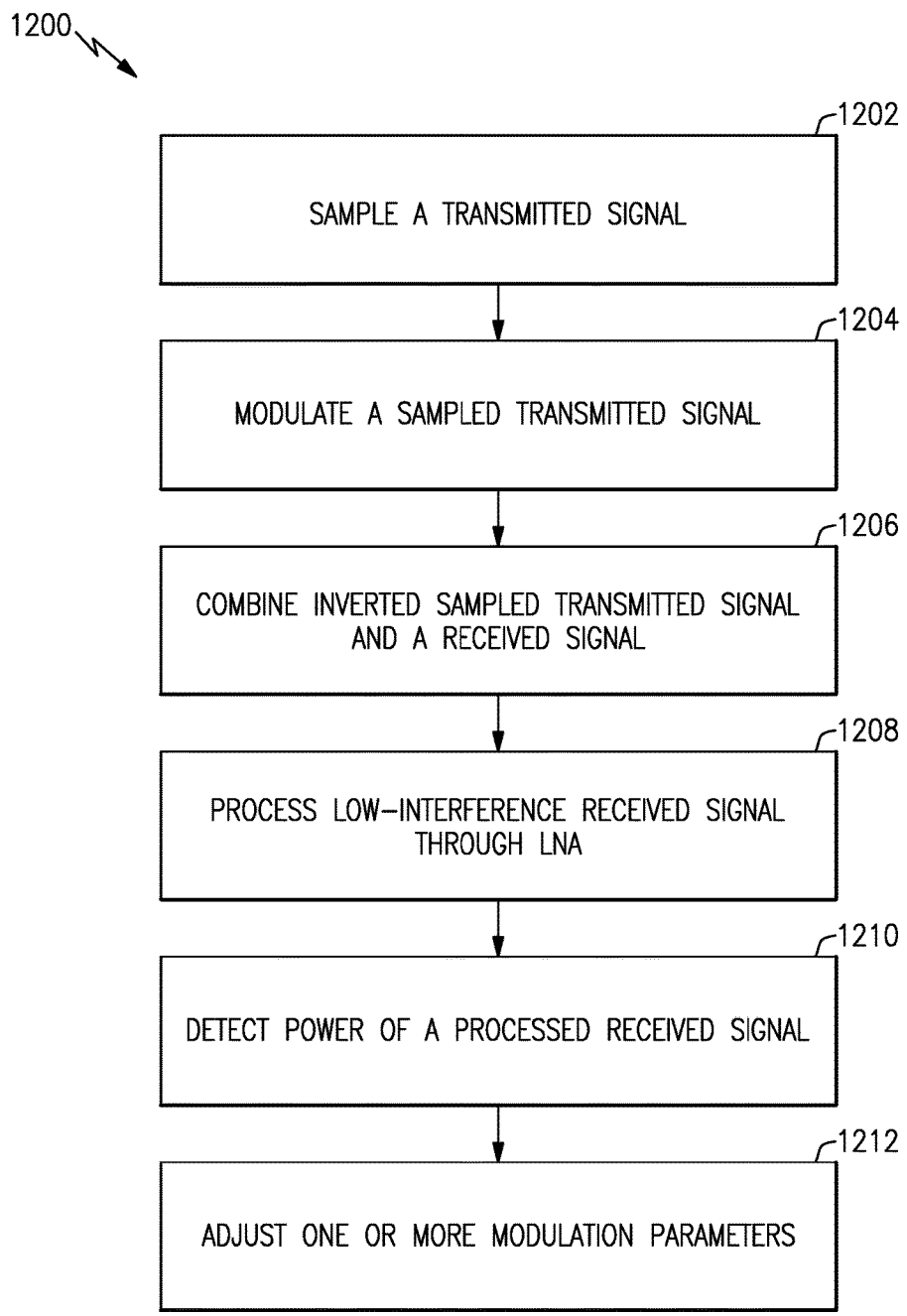
FIG. 12 is block diagram representing a method of reducing co-channel interference in accordance with one or more embodiments.

FIG. 12 is block diagram representing a method 1200 of reducing co-channel interference in accordance with one or more embodiments. In some implementations, method 1200 is performed at a system architecture such as architecture 200 described with respect to FIG. 2, and throughout the present disclosure. In some implementations, method 1200 is performed by radio-frequency circuitry implemented on a single semiconductor die. In some implementations, method 1200 is performed by a radio-frequency module, which may be implemented on a wireless device as described herein. Aspects of method 1200 described herein are applicable throughout the present disclosure, and aspects of circuits, systems, devices and modules for reducing co-channel interference are applicable to method 1200.

In some implementations, a method 1200 for reducing co-channel interference includes sampling a transmitted signal into a sampled transmitted signal, represented by block 1202. In some implementations, this sampling is performed by using a power coupler coupled to the output of a PA, as described with respect to FIG. 2. Method 1200 further includes modulating the sampled transmitted signal, as represented by block 1204. In some implementations, modulating the sampled transmitted signal includes adjusting the amplitude and/or phase of the sampled transmitted signal, to result in an inverted version of the sampled transmitted signal.

Block 1206 illustrates that method 1200 includes combining the inverted sampled transmitted signal with a received signal. In some implementations, this combining of signals results in a low-interference received signal. In some implementations, this combining of signals is performed by signal combiner circuitry, as described throughout this disclosure.

Block 1208 illustrates that in some implementations, method 1200 further includes processing the low-interference received signal through a low-noise amplifier. For example, as shown in FIG. 2, LNA 114 receives the output of signal combiner 210, and amplifies the received output signal (e.g., the combination of the inverted sampled transmitted signal and the received signal). In some implementations, processing the low-interference received signal includes the use of additional circuitry, such as one or more filters and/or baseband circuitry.

In some implementations, method 1200 includes amplifying the received signal through a low-noise amplifier before combining the resulting amplified received signal with the inverted sampled transmitted signal. In some implementations, this is performed in addition to processing the output of a signal combiner through an LNA after combining signals.

Block 1210 illustrates that in some implementations, method 1200 includes detecting the power of the amplified, or processed received signal. In some implementations, this detection is performed by control circuitry as described in particular with respect to FIG. 2. In some implementations, a dedicated received signal strength indicator (RSSI) circuit detects the power of the amplified or processed received signal. In some implementations, this power is detected on a periodic basis (e.g., every 100 ms). In some implementations, in response to detecting a power level of the amplified or processed received signal above a particular threshold for a predefined time (e.g., for 5 seconds or more), the frequency of detecting the power level of the amplified or processed received signal, is reduced (e.g., from every 100 ms to every 2 s).

Block 1212 illustrates that in some implementations, method 1200 includes adjusting one or more parameters for modulating one or more of the amplitude and phase of the sampled transmitted signal, based at least in part on the detected power of the amplified received signal. For example, in response to detecting a low signal-to-noise ratio and/or low received bit rate of the amplified or processed received signal (e.g., indicative of high interference), control circuitry as described with respect to FIG. 2, causes an adjustment in the modification of the phase and/or amplitude of the sampled transmitted signal, in order to better isolate the undesirable signal creating noise at the receiver. In some implementations, method 1200 includes repeated cycles of some or all processes. For example, in some implementations, method 1200 includes repeating the processes represented by blocks 1204 to 1210, while the receiver is receiving signals and/or until a threshold signal SNR or bit rate of the low-interference received signal (or amplified received signal) is detected. In some implementations, a calibration method is performed before performing method 1200. For example, a calibration method may include some of the sampling, detecting and/or adjusting processes of method 1200, but in a different order or at a different frequency of operation than in method 1200. In some implementations, one or more of the various signals described herein (e.g., transmitted signal, sampled transmitted signal, inverted sampled transmitted signal, received signal, amplified received signal, processed received signal) are RF signals.

Examples of Implementations in Products

Figure 13A:
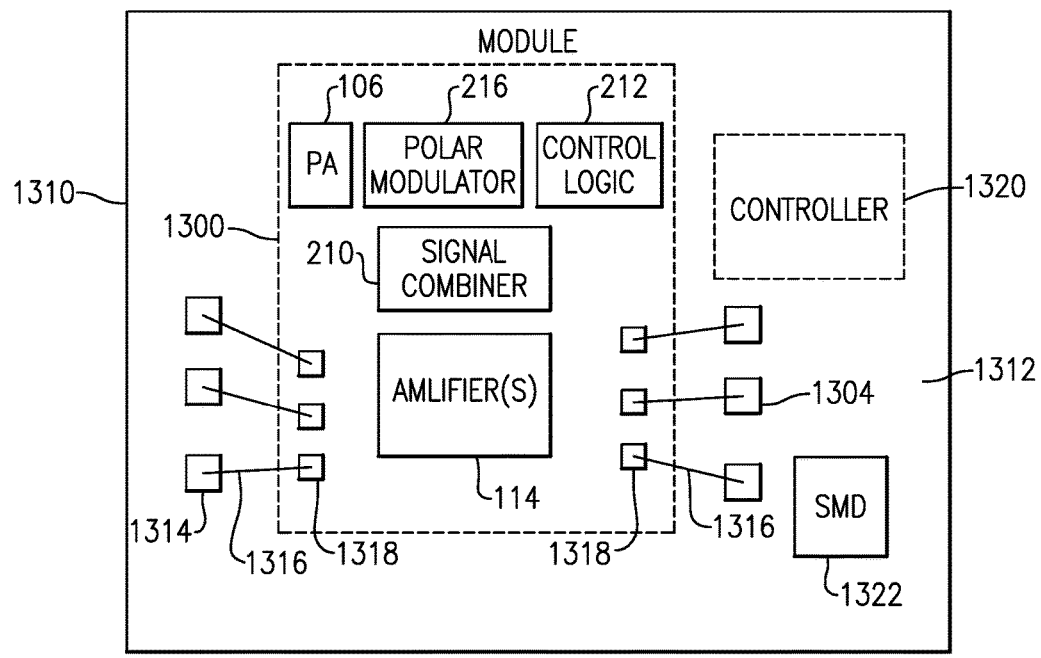
FIGS. 13A and 13B show plan and side views, respectively, of a packaged module having one or more features as described herein according to one or more embodiments.

In some embodiments, one or more die having one or more features described herein can be implemented in a packaged module. An example of such a module is shown in FIGS. 13A (plan view) and 13B (side view). A module 1310 is shown to include a packaging substrate 1312. Such a packaging substrate can be configured to receive a plurality of components, and can include, for example, a laminate substrate. The components mounted on the packaging substrate 1312 can include one or more dies. In the example shown, a die 1300 having one or more combined low-noise amplifiers 114, signal combiners 210, power amplifiers 106, polar modulators 216 and/or control logic 212, as described herein, is shown to be mounted on the packaging substrate 1312. In some implementations, as described herein, the one or more polar modulators 216 include one or more power couplers, and in some implementations, the control logic 212 includes a received signal strength indicator unit. The die 1300 can be electrically connected to other parts of the module (and with each other where more than one die is utilized) through connections such as connection-wirebonds 1316. Such connection-wirebonds can be formed between contact pads 1318 formed on the die 1300 and contact pads 1314 formed on the packaging substrate 1312. In some embodiments, one or more surface mounted devices (SMDs) 1322 can be mounted on the packaging substrate 1312 to facilitate various functionalities of the module 1310.

In some embodiments, the packaging substrate 1312 can include electrical connection paths for interconnecting the various components with each other and/or with contact pads for external connections. For example, a connection path 1332 is depicted as interconnecting the example SMD 1322 and the die 1300. In another example, a connection path 1332 is depicted as interconnecting the SMD 1322 with an external-connection contact pad 1334. In yet another example a connection path 1332 is depicted as interconnecting the die 1300 with ground-connection contact pads 1336.

In some embodiments, a space above the packaging substrate 1312 and the various components mounted thereon can be filled with an overmold structure 1330. Such an overmold structure can provide a number of desirable functionalities, including protection for the components and wirebonds from external elements, and easier handling of the packaged module 1310.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 14:
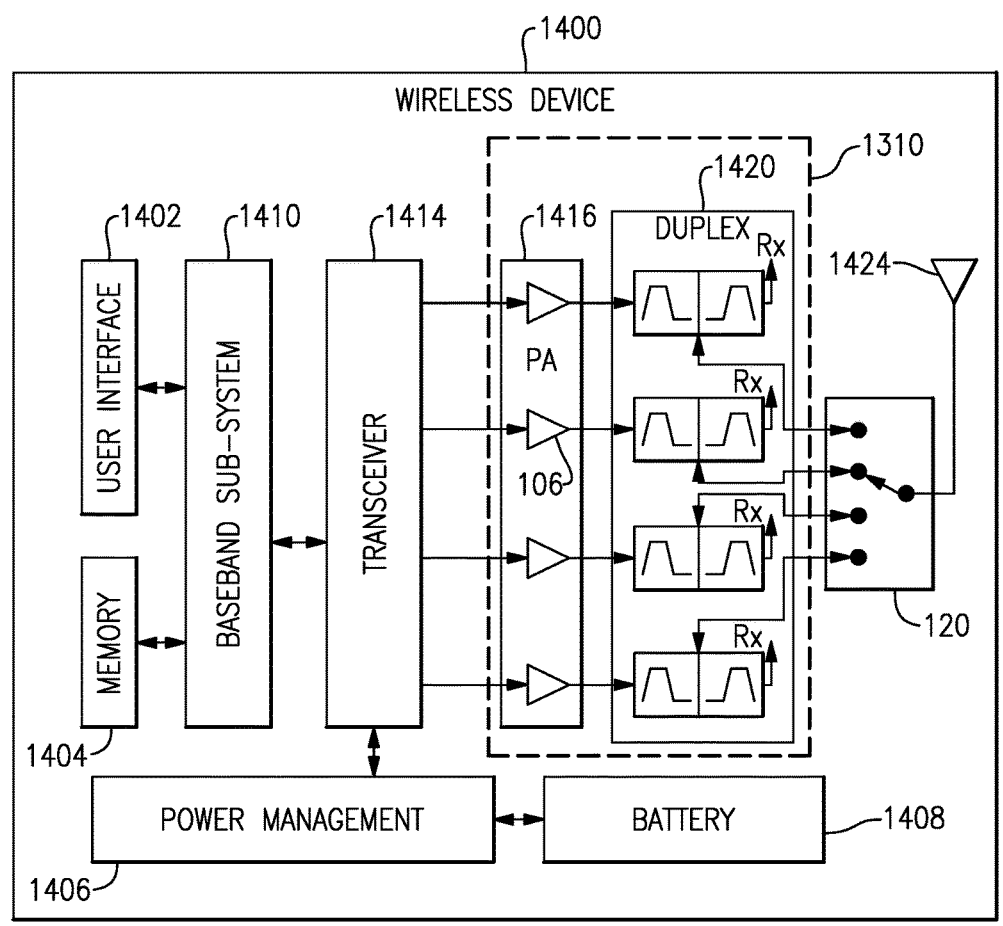
FIG. 14 depicts an example wireless device having one or more advantageous features described herein according to one or more embodiments.

FIG. 14 schematically depicts an example wireless device 1400 having one or more advantageous features described herein. The wireless device 1400 may include one or more low-noise amplifiers (LNAs) combined with signal combining circuitry, control logic, polar modulation circuitry and/or power coupling circuitry, as described in detail herein. For example, the duplexer module 1420 may include receiver path(s) associated with one or more LNA/signal combiners.

Figure 13B:
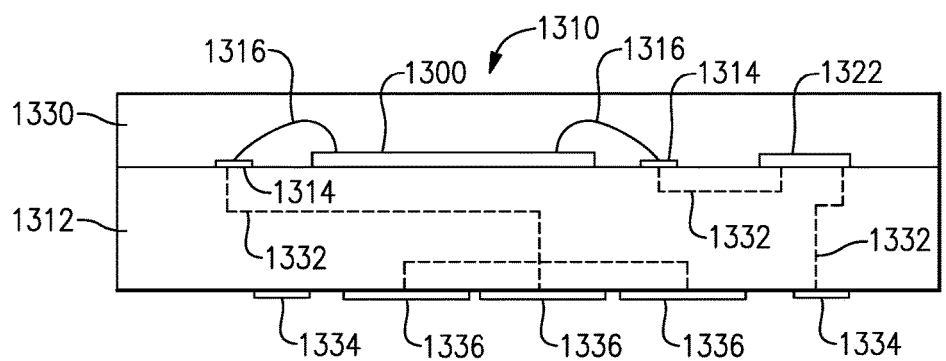

In the example wireless device 1400, a power amplifier (PA) module 1416 having one or more power amplifiers 106 (PAs) can provide an amplified RF signal to the switch 120 (via a duplexer 1420), and the switch 120 can route the amplified RF signal to an antenna 1424. The PA module 1416 can receive an unamplified RF signal from a transceiver 1414 that can be configured and operated in known manners. The transceiver 1414 can also be configured to process received signals. In some implementations, the PA module 1416 and duplexer 1420 are implemented in a single module 1310 as described with respect to FIG. 13. In some implementations, module 1310 includes additional components such as, but not limited to one or more power couplers, attenuators, phase shifters, signal combiners, control logic, RSSI control blocks and LNAs.

The transceiver 1414 is shown to interact with a baseband sub-system 1410 that is configured to provide conversion between data and/or voice signals suitable for a user and RF signals suitable for the transceiver 1414. The transceiver 1414 is also shown to be connected to a power management component 1406 that is configured to manage power for the operation of the wireless device 1400. Such a power management component can also control operations of the baseband sub-system and/or one or more other components or modules of the device 1400. In some implementations, a receiver of a transceiver 1414, as described in the present disclosure, operates simultaneously with a transmitter of the same transceiver 1414.

The baseband sub-system 1410 is shown to be connected to a user interface 1402 to facilitate various input and output of voice and/or data provided to and received from the user. The baseband sub-system 1410 can also be connected to a memory 1404 that is configured to store data and/or instructions to facilitate the operation of the wireless device, and/or to provide storage of information for the user.

In some embodiments, the duplexer 1410 can allow transmit and receive operations to be performed simultaneously using a common antenna (e.g., 1424). In FIG. 14, received signals are shown to be routed to "Rx" paths (not shown) that can include, for example, a low-noise amplifier (LNA) combined with signal combining circuitry and/or control logic, as disclosed herein. A number of other wireless device configurations can utilize one or more features described herein. In another example, a wireless device can include additional antennas such as diversity antenna, and additional connectivity features such as Wi-Fi, Bluetooth, and GPS.

General Comments

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency circuit comprising:
a polar modulator configured to invert a sampled transmitted signal into an inverted sampled transmitted signal, the polar modulator including at least a quadrant phase shifter and a fine phase shifter for modifying a phase of the sampled transmitted signal, the quadrant phase shifter including an ambidextrous quadrant selector including a first inductor and a second inductor;
a signal combiner configured to combine the inverted sampled transmitted signal with a received signal; and a control logic circuit coupled to the polar modulator, the control logic circuit configured to adjust one or more tuning parameters of the polar modulator.

2. The radio-frequency circuit of claim 1 further comprising a directional coupler configured to sample a transmitted signal into the sampled transmitted signal.

3. The radio-frequency circuit of claim 1 further comprising a low-noise amplifier.

4. The radio-frequency circuit of claim 3 wherein the received signal is output from the low-noise amplifier.

5. The radio-frequency circuit of claim 3 wherein the low-noise amplifier receives an output signal from the signal combiner.

6. The radio-frequency circuit of claim 5 wherein the control logic circuit receives a sampled output signal from the low-noise amplifier.

7. The radio-frequency circuit of claim 6 further comprising a received signal strength indicator coupled to the control logic circuit for detecting a power output of the low-noise amplifier.

8. The radio-frequency circuit of claim 1 wherein the control logic circuit is further configured to adjust one or more tuning parameters of the polar modulator based at least in part on the power output of the low-noise amplifier.

9. The radio-frequency circuit of claim 1 wherein the polar modulator includes an attenuator for modifying the amplitude of the sampled transmitted signal.

10. The radio-frequency circuit of claim 1 further comprising a power coupler configured to sample the output power of a power amplifier to generate the sampled transmitted signal.

11. The radio-frequency circuit of claim 1 wherein the sampled transmitted signal and the received signal are each within a single frequency band of a plurality of adjacent frequencies.

12. The radio-frequency circuit of claim 11 wherein the sampled transmitted signal and the received signal each have approximately the same frequency.

13. A radio-frequency module comprising:
a packaging substrate configured to receive a plurality of components; and
a semiconductor die mounted on the packaging substrate, the semiconductor die including a radio-frequency circuit including a polar modulator circuit configured to invert a sampled transmitted signal into an inverted sampled transmitted signal, the polar modulator including at least a quadrant phase shifter and a fine phase shifter for modifying a phase of the sampled transmitted signal, the quadrant phase shifter including an ambidextrous quadrant selector including a first inductor and a second inductor, a signal combiner circuit configured to combine the inverted sampled transmitted signal with a received signal, and a control logic circuit coupled to the polar modulator, the control logic circuit configured to adjust one or more tuning parameters of the polar modulator.

14. The radio-frequency module of claim 13 wherein the radio-frequency circuit of the semiconductor die further includes a directional coupler configured to sample a transmitted signal into the sampled transmitted signal.

15. The radio-frequency module of claim 13 wherein the radio-frequency circuit of the semiconductor die further includes a low-noise amplifier.

16. The radio-frequency module of claim 15 wherein the low-noise amplifier receives an output signal from the signal combiner.

17. The radio-frequency module of claim 16 wherein the control logic circuit receives a sampled output signal from the low-noise amplifier.

18. The radio-frequency module of claim 17 wherein the control logic circuit is coupled to a received signal strength indicator for detecting a power output of the low-noise amplifier.

19. A radio-frequency device comprising:
a transceiver configured to process radio-frequency signals;
one or more antennas in communication with the transceiver, the one or more antennas configured to facilitate transmission of an amplified radio-frequency signal; and
a radio-frequency circuit connected to the transceiver, the radio-frequency circuit including a polar modulator configured to invert a sampled transmitted signal into an inverted sampled transmitted signal, the polar modulator including at least a quadrant phase shifter and a fine phase shifter for modifying a phase of the sampled transmitted signal, the quadrant phase shifter including an ambidextrous quadrant selector including a first inductor and a second inductor, a signal combiner configured to combine the inverted sampled transmitted signal with a received signal, and a control logic circuit coupled to the polar modulator, the control logic circuit configured to adjust one or more tuning parameters of the polar modulator.

20. The radio-frequency device of claim 19 wherein the radio-frequency device includes a wireless device.

* * * * *